United States Patent
Horvath

(10) Patent No.: US 8,814,389 B2
(45) Date of Patent: Aug. 26, 2014

(54) METAL CORE PRINTED CIRCUIT BOARD AS HEAT SINK FOR LEDS

(71) Applicant: O P I Products, Inc., North Hollywood, CA (US)

(72) Inventor: Gavril Horvath, Tarzana, CA (US)

(73) Assignee: O P I Products, Inc., North Hollywood, CA (US)

(*) Notice: Subject to any disclaimer, the term of this patent is extended or adjusted under 35 U.S.C. 154(b) by 78 days.

(21) Appl. No.: 13/706,303

(22) Filed: Dec. 5, 2012

(65) Prior Publication Data

US 2014/0153245 A1 Jun. 5, 2014

(51) Int. Cl.
*F26B 3/28* (2006.01)
*F21K 99/00* (2010.01)

(52) U.S. Cl.
CPC .... *F21K 9/00* (2013.01); *F26B 3/28* (2013.01)
USPC ... 362/249.02; 362/234; 362/253; 250/504 R; 132/73; 118/620; 34/275

(58) Field of Classification Search
USPC ............. 362/249.02, 234, 253; 250/504 R; 132/73; 118/620; 34/275
See application file for complete search history.

(56) References Cited

U.S. PATENT DOCUMENTS

| 8,242,475 | B1* | 8/2012 | Cheng | 250/504 R |
| 8,450,705 | B1* | 5/2013 | Chen et al. | 250/492.1 |
| 8,466,442 | B2* | 6/2013 | Horvath et al. | 250/504 R |
| 2010/0293805 | A1* | 11/2010 | Chang | 34/202 |
| 2011/0277338 | A1* | 11/2011 | Li et al. | 34/275 |

* cited by examiner

*Primary Examiner* — Laura Tso
(74) *Attorney, Agent, or Firm* — Blakely Sokoloff Taylor & Zafman

(57) ABSTRACT

Power LEDs are implanted in a specially designed printed circuit board (PCB) that is known in the art as a Metal Core Printed Circuit Board (MCPCB). The MCPCB is bended over to so as to have rounded corners having a radius that is not smaller than a determined value depending of the overall thickness of the MCPCB and other factors without any negative effects on the insulating layer and copper traces in the area of bending. In this manner, the surface area of the heat sink used in an LED nail care curing appliance is increased. The MCPCB with installed LEDs with rounded corners thereby follows the natural curvature (based on the shape of a human hand) of the appliance housing, eliminating the need for additional heat sinks or fans to reduce the heat generated by the LEDs.

2 Claims, 4 Drawing Sheets

METAL CORE PRINTED CIRCUIT BOARD AS HEAT SINK FOR LEDS

FIELD OF THE INVENTION

The invention is directed to the field of appliances used by nail care professionals to cure nail gel or other coating applied to the fingernails. The invention is specifically directly to the use of LEDs as a source of ultra-violet radiation for such curing.

BACKGROUND OF THE INVENTION

Although normally used as a light source, ultra-violet emitting Light Emitting Diodes (LEDs) emit ultra-violet (UV) radiation e.g., 400 nm. which can be used in applications where such radiation is a desired property. For example, in the nail care field, LEDs known as power LEDs can be placed in a housing shaped to receive the fingers of a human hand so that when nail gel or other nail coating is applied, by inserting the fingers into the housing, the UV radiation is used to cure the coating which operates to solidify the gel, changing it from a fluid state to a solid state. However, use of LEDs in such an environment creates a critical issue which must be dealt with, namely thermal management. That is, the need to remove the heat from the junction used to form the LED and dissipate it. This is necessary because in fractions of a second, the junction (the semiconductor area that generates the light) reaches a temperature close to 125 degree Celsius. If the heat is not guided away, the junction will overheat which translates first in a drop of light output of the LED and later on self-destruction of the device.

BRIEF SUMMARY OF THE INVENTION

According to the invention, power LEDs are implanted in a specially designed printed circuit board (PCB) that is known in the art as a Metal Core Printed Circuit Board (MCPCB). A regular PCB is one layer or multiple layers of thin copper on an insulating substrate such as fiber glass. By way of contrast, a MCPCB has a regular copper layer that is used for the traces and soldering pads, a very thin special insulating material which is a very good thermo-conductor, and a layer of aluminum. By using a MCPCB, heat from a device such as an LED is transferred through the insulating layer to the aluminum where, given the special thermo-conductive properties of the aluminum, the heat spreads and is dissipated. The larger the aluminum surface area, the better the ventilation (air movement), and the lower the ambient temperature the better the cooling effect. Although MCPCBs are well known, the invention, based on studies which show the effect of bending of the MCPCB under different bending angles, uses an MCPCB which is bended over a radius that is not smaller than a determined value (depending of the overall thickness of the MCPCB) without any negative effects on the insulating layer and copper traces in the area of bending. When bent in this manner, it is possible to at least double the surface area of the heat sink used in an LED nail care heating appliance. By bending an MCPCB with installed LEDs to follow the natural curvature (based on the shape of a human hand) of the appliance housing, the need for additional heat sinks or fans to control the heat generated by the LEDs is eliminated. In this manner, which is a very simple and economic solution, the heat dissipation surface is increased. Tests show that under identical ambient conditions (room temperature and air flow) there is a difference of 5-6 degree Celsius between the temperature measured on a regular straight surface that fits in a particular housing and one that has the added surface area gained through the bending of the MCPCB.

DETAILED DESCRIPTION OF THE INVENTION

Figure 1:
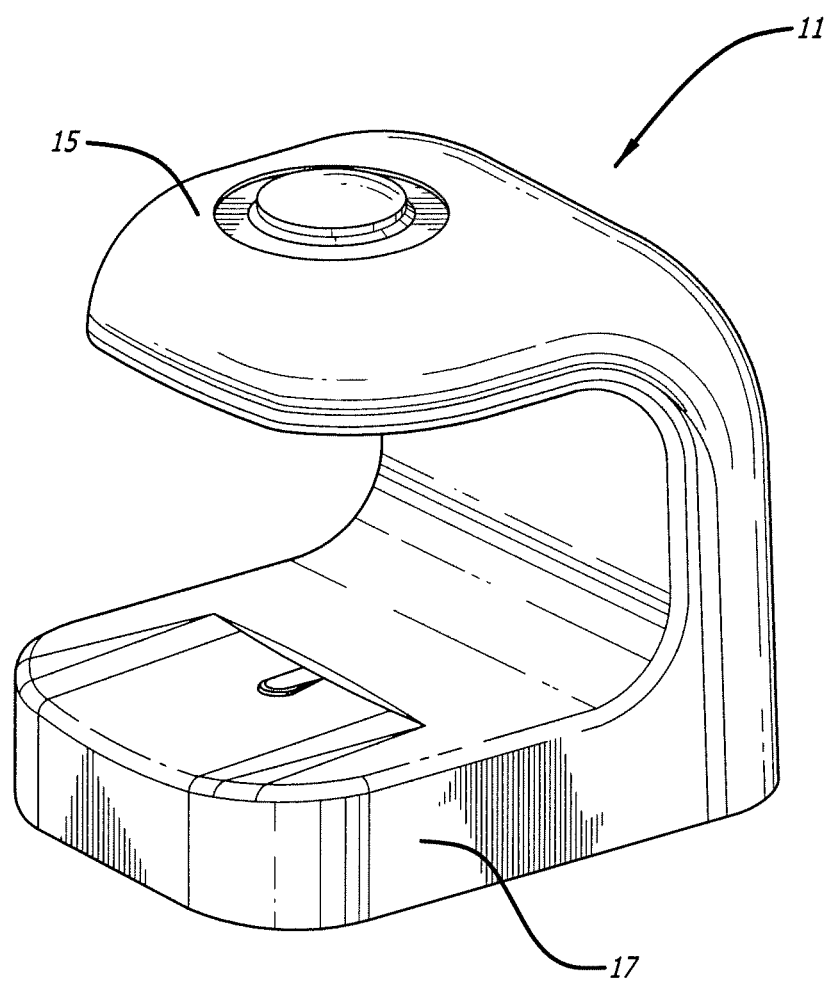
FIG. 1 is a perspective view of a fingernail coating drying apparatus of the type suitable for use with the invention.
Figure 2:
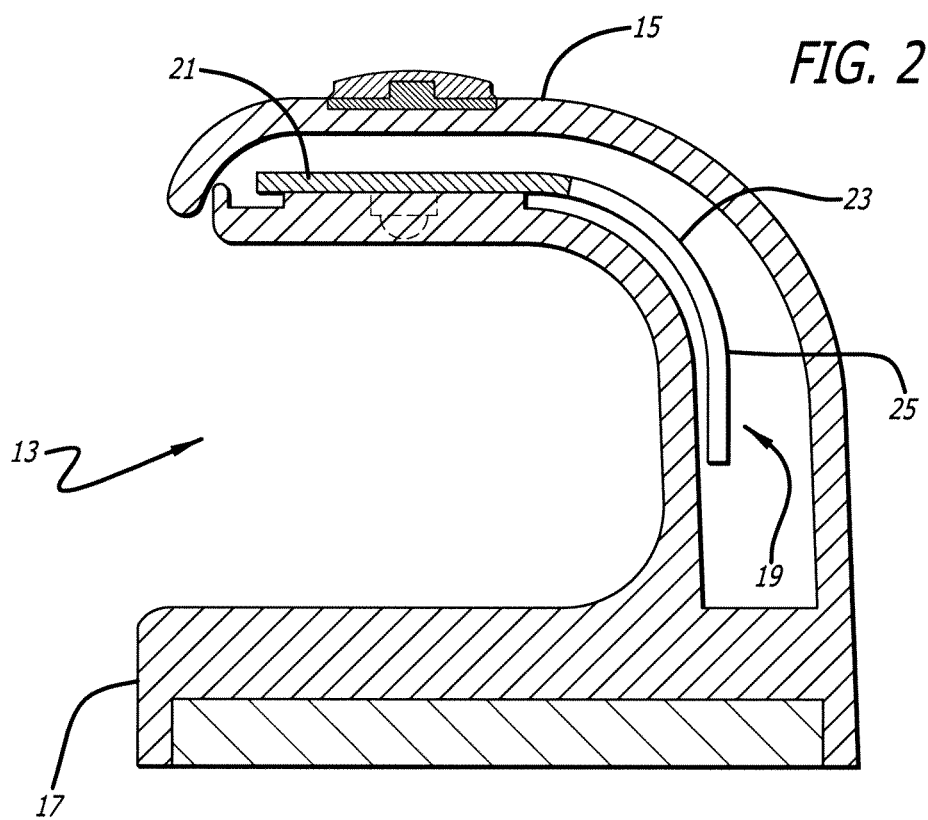
FIG. 2 is a partial cut-away, side view of the a fingernail coating showing placement of the metal core PCB within the fingernail drying apparatus.

Referring first to FIG. 1, the invented fingernail drying apparatus 11 is shown having a top portion 15 and base 17. FIG. 2 shows the invented fingernail drying apparatus in a partial cutaway, side view including an opening 13 into which a hand with fingernails coated with nail polish or the like to be dried is inserted. Located within the top portion is a metal core printed circuit board 19 which is described in further detail in FIGS. 3-6. Although not shown in FIG. 2, board 19 has a set of LEDs facing downward from top 15 towards base 17.

Figure 3:
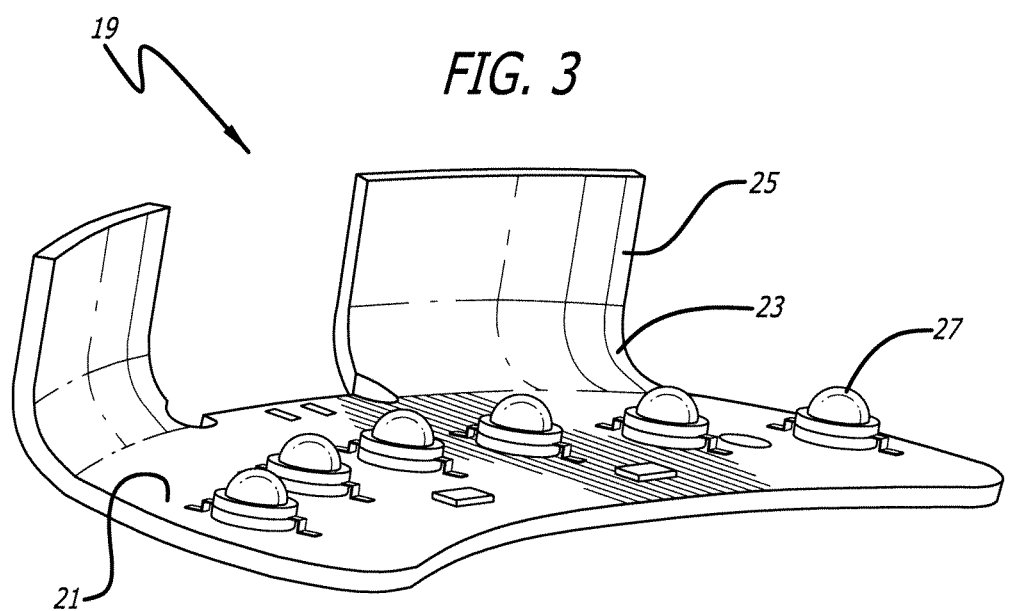
FIG. 3 is a top, perspective view showing a metal core PCB configured for use as a heat sink with LEDs installed.
Figure 4:
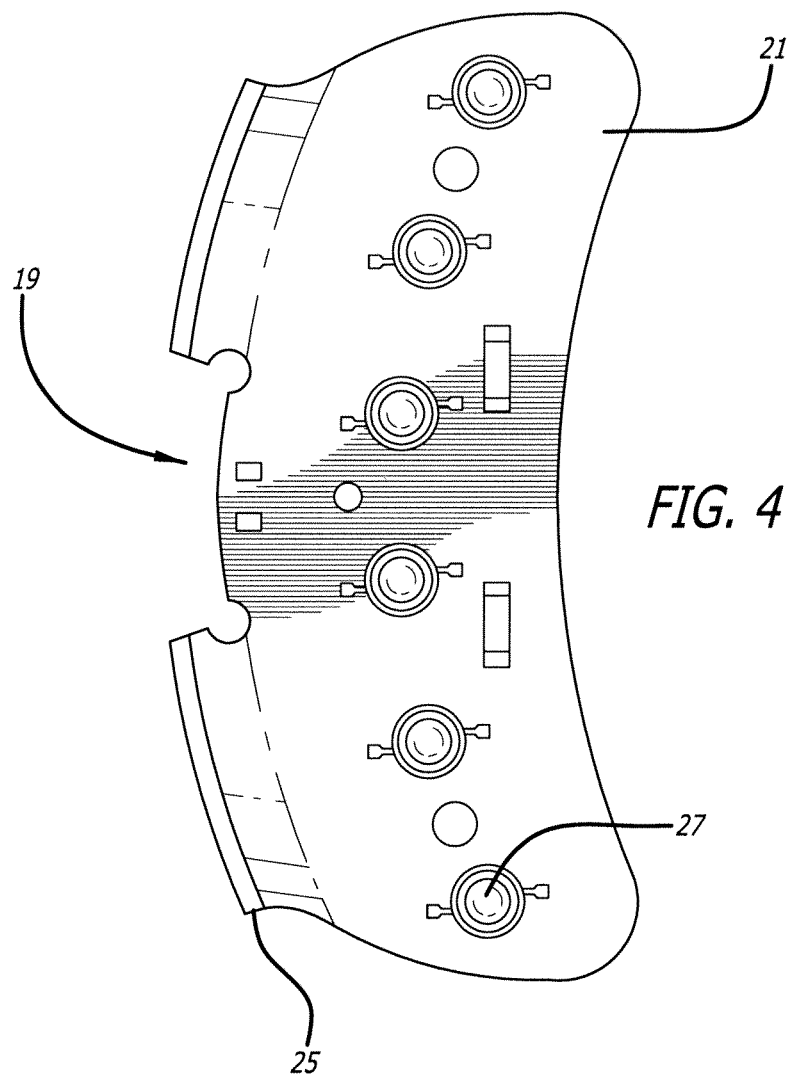
FIG. 4 is a top plan view of the metal core PCB configured for use as a heat sink with LEDs installed.
Figure 5:
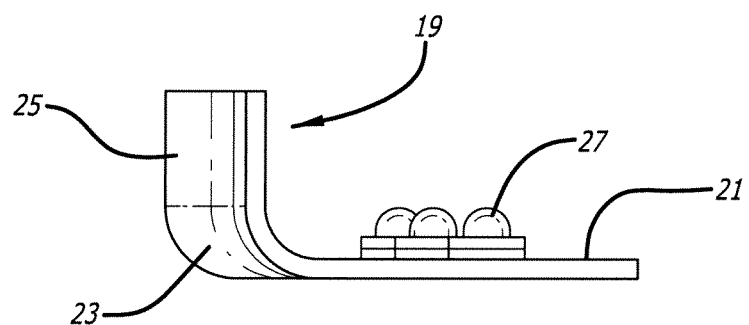
FIG. 5 is a side view of the metal core PCB configured for use as a heat sink with LEDs installed.
Figure 6:
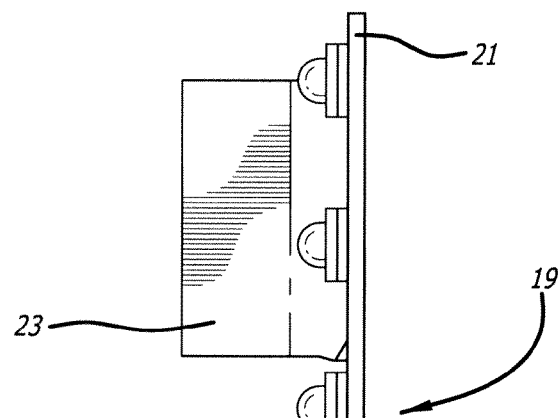
FIG. 6 is front elevation view of the metal core PCB configured for use as a heat sink with LEDs installed.
Figure 7:
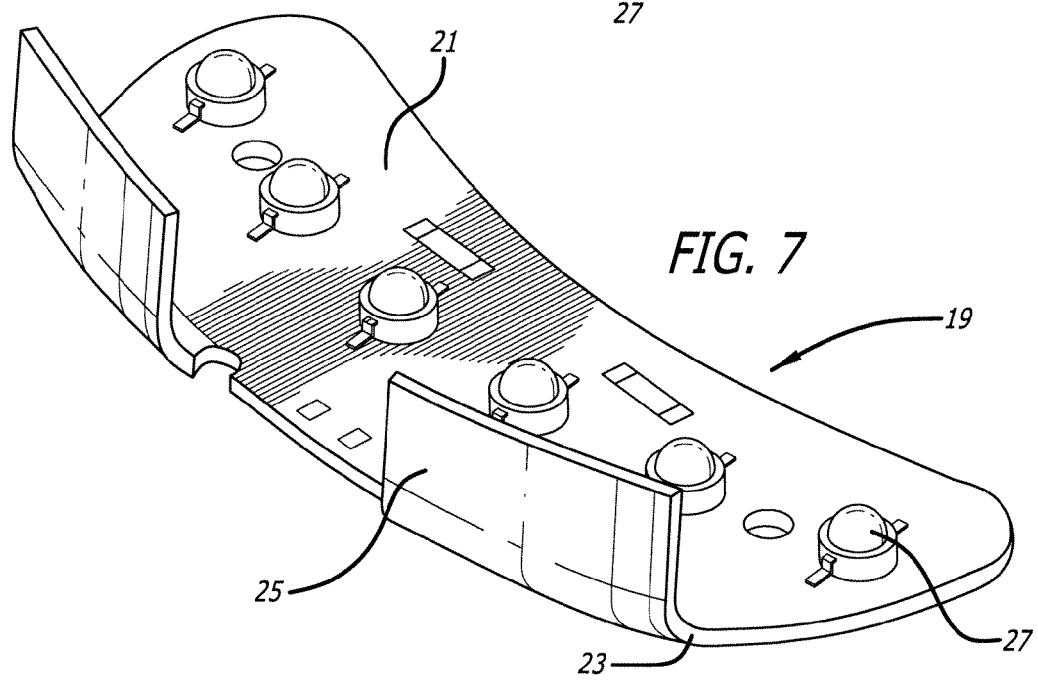
FIG. 7 is rear perspective view of the metal core PCB configured for use as a heat sink with LEDs installed.

FIG. 3 shows the invented MCPCB 19 having a base 21, rounded corners 23 and extensions 25 from the rounded corners. Installed on base 21 is a set of LEDs 27. FIGS. 4-7 are top plan, side, front elevation and rear perspective views of board 19, respectively which are provided to clearly show the relationship between the mounted LEDs 27, rounded corners 23 and extended portions 25.

By providing MCPCB 19 with the rounded corners 23 and straight portions 25, additional surface area is obtained which provides additional surface area so as to disburse heat generated by LEDs 27. Since the size of the board is constrained by the overall dimensions of apparatus 11, and bending the board too little will not provide the necessary additional surface area, and bending the board too much is likely to break wires or traces contained within board, it is important that the radius of the rounded corners satisfy certain criteria. The rounded corner has a radius which is determined by the thickness of the insulating layer, the thickness of the aluminum layer and by the nature of materials used in the insulating layer. The factors which must be taken into account are the mechanical properties of the materials used to form the MCPCB, the specifics of which are well within the abilities of those skilled in the art based on the descriptions provided herein.

This configuration allows board 19 to serve as a heat sink which allows sufficient heat to be generated so as to enable the finger nail drying apparatus to reach an internal temperature to properly function while keeping the LEDs at a temperature sufficiently low so as to prevent their destruction by overheating. In the disclosed embodiment, there are six one-watt ultraviolet LEDs mounted on the MCPCB. A different number of LEDs and/or a different wattage may require some changes in the sizing of the rounded corners 23 and straight portions 25. However, to the extent that changes may be needed, such changes would be well within the skills of a person having ordinary skill in the field of the invention based upon the disclosure provided herein.

I claim:

1. A fingernail coating curing apparatus comprising:
    a) a housing with an opening configured to receive fingers of a human hand;
    b) a metal core printed circuit board with a plurality of LEDs mounted thereon;
    wherein said metal core printed circuit board includes a bended portion for increasing surface area of said metal core printed circuit board in an area surrounding said mounted LEDs, and said bended portion has a radius which is function of a thickness of an insulating layer and metal layer of said metal core printed circuit board, and a material used as said insulating layer.

2. The fingernail coating curing apparatus defined by claim 1 wherein said LEDs are mounted facing downward from a top of said housing towards a base of said housing.

\* \* \* \* \*